United States Patent [19]
Wang et al.

[11] Patent Number: 5,686,324
[45] Date of Patent: Nov. 11, 1997

[54] PROCESS FOR FORMING LDD CMOS USING LARGE-TILT-ANGLE ION IMPLANTATION

[75] Inventors: Chih-Hsien Wang; Min-Liang Chen, both of Hsinchu, Taiwan

[73] Assignee: Mosel Vitelic, Inc., Hsinchu, Taiwan

[21] Appl. No.: 625,587

[22] Filed: Mar. 28, 1996

[51] Int. Cl.$^6$ .................................................. H01L 21/265
[52] U.S. Cl. ............................ 437/34; 437/44; 437/56; 437/57; 437/58
[58] Field of Search .................... 437/34, 44, 56, 437/57, 58

[56] References Cited

U.S. PATENT DOCUMENTS

| | | | |
|---|---|---|---|
| Re. 32,800 | 12/1988 | Han et al. | 437/27 |
| 4,577,391 | 3/1986 | Hsia et al. | 437/56 |
| 4,697,333 | 10/1987 | Nakahara | 437/20 |
| 4,771,014 | 9/1988 | Liou et al. | 437/34 |
| 4,843,023 | 6/1989 | Chiu et al. | 437/34 |
| 4,859,620 | 8/1989 | Wei et al. | 437/44 |
| 4,891,326 | 1/1990 | Koyanagi | 437/29 |
| 4,949,136 | 8/1990 | Jain | 357/23.3 |
| 4,968,539 | 11/1990 | Bergonzoni | 437/57 |
| 4,978,526 | 12/1990 | Poon et al. | 437/44 |
| 4,997,782 | 3/1991 | Bergonzoni | 437/44 |
| 5,024,960 | 6/1991 | Haken | 437/44 |
| 5,060,033 | 10/1991 | Takeuchi | 357/23.4 |
| 5,170,232 | 12/1992 | Narita | 257/336 |
| 5,183,771 | 2/1993 | Mitsui et al. | 437/44 |
| 5,208,472 | 5/1993 | Su et al. | 257/344 |
| 5,217,910 | 6/1993 | Shimizu et al. | 437/35 |
| 5,258,319 | 11/1993 | Inuishi et al. | 437/35 |
| 5,334,870 | 8/1994 | Katada et al. | 257/371 |
| 5,349,225 | 9/1994 | Redwine et al. | 257/336 |
| 5,372,957 | 12/1994 | Liang et al. | 437/35 |
| 5,409,848 | 4/1995 | Han et al. | 437/35 |
| 5,516,711 | 5/1996 | Wang | 437/44 |
| 5,532,176 | 7/1996 | Katada et al. | 437/44 |

FOREIGN PATENT DOCUMENTS

| | | | |
|---|---|---|---|
| 64-64364 | 3/1989 | Japan | H01L 29/78 |
| 403273623 | 12/1991 | Japan | 437/34 |
| 5-251697 | 9/1993 | Japan | H01L 29/784 |

OTHER PUBLICATIONS

Wolf, "Process Technology," *Silicon Processing for the VLSI ERA,* vol. 1, pp. 292–294 (1986).

Wolf, "Process Integration," *Silicon Processing for the VLSI ERA,* vol. 2, pp. 428–434 (1990).

*Primary Examiner*—Jey Tsai
*Assistant Examiner*—Long Pham
*Attorney, Agent, or Firm*—Townsend and Townsend and Crew LLP

[57] ABSTRACT

A method and resulting integrated circuit device, and in particular a CMOS integrated circuit device, having a fabrication method and structure therefor for an improved lightly doped drain region. The method includes the steps of providing a semiconductor substrate with a P type well region and an N type well region. Gate electrodes are formed overlying gate dielectic over each P type well and N type well regions. The method then performs a blanket N type implant step at an angle being about 45° or greater from a perpendicular to the gate electrodes in both the P type and N type well regions. The blanket N type implant forms an LDD region in the P type well region. Sidewall spacers are then formed on edges of the gate electrodes. The method then performs two separate N type implants into the P type well region, each at different angles and dosages to form the N type LDD source/drain region for an NMOS device. The method also performs two separate P type implants into the N type well region, each at different angles and dosages to form the P type LDD source/drain region for a PMOS device. The present LDD fabrication method provides a relatively consistent and easy to fabricate CMOS LDD region, with less masking steps and improved device performance.

11 Claims, 11 Drawing Sheets

PROCESS FOR FORMING LDD CMOS USING LARGE-TILT-ANGLE ION IMPLANTATION

BACKGROUND OF THE INVENTION

The present invention relates to semiconductor integrated circuits and their manufacture. The invention is illustrated in an example with regard to the manufacture of a lightly doped drain (LDD) region of a field effect transistor, and more particularly to the manufacture of a complementary metal oxide semiconductor (CMOS) field effect transistor, but it will be recognized that the invention has a wider range of applicability. Merely by way of example, the invention may be applied in the manufacture of other semiconductor devices such as metal oxide semiconductor (MOS) field effect transistors, bipolar complementary metal oxide semiconductor (BiCMOS) field effect transistors, among others.

Industry utilizes or has proposed techniques for the manufacture of a CMOS integrated circuit device, and in particular an LDD CMOS fabrication method. An example of this CMOS fabrication method includes steps of defining a gate electrode onto a well region. By way of the gate electrode, an LDD region is formed onto the well region by a self-aligned implant process. Sidewall spacers are then formed on gate electrode sides by a chemical vapor deposition (CVD) technique. A second higher dose implant is then performed within the periphery of the LDD region. The combination of the LDD region and the second higher dose implant defines source/drain regions for the CMOS device. This CMOS device is defined by an NMOS transistor and a PMOS transistor.

The PMOS device used in conventional CMOS technology, and in particular the LDD region, includes a limitation of difficulty with a P− type threshold implant step. The conventional PMOS device has oxide spacers made by CVD which are thick, relative to other device dimensions. In fact, the oxide spacers thicknesses range from about 1,500 Å to about 2,000 Å. This means the P− type implant is often deep, and therefore difficult to control. The difficulty in controlling the implant often creates an inconsistent resulting implant. By the inconsistent implant, the conventional PMOS device is often difficult to reduce in size. A punch-through effect is also difficult to control in the conventional PMOS device, as device dimension decreases.

As state-of-the-art devices rely upon these smaller dimensions, particulate contamination control also becomes more important. Particulate contamination from the fabrication process often reduces the amount of "good die" on a wafer by causing problems such as short-circuits and other process related difficulties. Generally, more process steps increase the likelihood of contaminants affecting the integrated circuit. A conventional CMOS process relies on at least five separate masks to form the LDD and source/drain regions for NMOS and PMOS devices. As industry attempts to increase "good die" or yield on the wafer, it is often desirable to reduce the number of masks (or masking steps) used during wafer manufacture.

From the above it is seen that a method of fabricating a semiconductor LDD structure that is easy, reliable, faster, and cost effective, is often desired.

SUMMARY OF THE INVENTION

The present invention provides a method and resulting integrated circuit device, and in particular a CMOS integrated circuit device having a fabrication method and structure therefor for an improved lightly doped drain region. The present LDD fabrication method provides a relatively consistent and easy to fabricate CMOS LDD region, with less masking steps and improved device performance.

According to an embodiment, the present invention provides a method of fabricating a CMOS integrated circuit device. The present method includes providing a semiconductor substrate, the semiconductor substrate including a first well region of a first conductivity type and a second well region of a second conductivity type. The first well region has a first gate electrode overlying a first gate dielectric layer, and the second well region has a second gate electrode overlying a second gate dielectric layer. The method also includes blanketly introducing a first impurity of the second conductivity type into the first well region and the second well region, the first impurity in the first well region defining a first LDD region. The present method also includes forming first sidewall spacers on edges of the first gate electrode and second sidewall spacers on edges of the second gate electrode. Further steps of the method include introducing a second impurity of the second conductivity type into the first well region and introducing a third impurity of the second conductivity type into the first well region, the second impurity in the first well region defining a first dose of a first source/drain region and the third impurity in the first well region defining a second dose of the first source/drain region. The method also includes introducing a fourth impurity of the first conductivity type into the second well region and introducing a fifth impurity of the first conductivity type into the second well region, the fourth impurity in the second well region defining a second LDD region, the fifth impurity in the second well region defining a second source/drain region.

In accordance with another embodiment, the present invention provides a CMOS integrated circuit device. The device includes a semiconductor substrate, the semiconductor substrate including a first well region of a first conductivity type and a second well region of a second conductivity type. The first well region has a first gate electrode overlying a first gate dielectric layer, and the second well region has a second gate electrode overlying a second gate dielectric layer. In the present device, a first impurity in the first well region defines a first LDD region, the first impurity of the second conductivity type being blanketly introduced into the first well region and the second well region. The present device also includes first sidewall spacers on edges of the first gate electrode and second sidewall spacers on edges of the second gate electrode. A second impurity in the first well region defines a first dose of a first source/drain region and a third impurity in the first well region defines a second dose of the first source/drain region. The second impurity is of said second conductivity type and the third impurity is of said second conductivity type. In the present device, a fourth impurity in the second well region defines a second LDD region and a fifth impurity in the second well region defines a second source/drain region, the fourth impurity being of the first conductivity type and a fifth impurity being of the first conductivity type.

The present invention achieves these benefits in the context of known process technology. However, a further understanding of the nature and advantages of the present invention may be realized by reference to the latter portions of the specification and attached drawings.

DESCRIPTION OF SPECIFIC EMBODIMENTS

Conventional LDD Fabrication Methods

A simplified conventional LDD fabrication method for a CMOS device may be briefly outlined as follows.

(1) Provide a semiconductor substrate.

(2) Grow oxide layer.

(3) Form P type wells and N type wells.

(4) Form field isolation oxide regions using the local oxidation of silicon (LOCOS).

(5) Deposit gate polysilicon layer (or poly 1 layer) and dope.

(6) Form cap oxide layer overlying gate polysilicon layer.

(7) Mask 1: Define gate polysilicon layer to form polysilicon gate regions.

(8) Mask 2: Define N- type LDD regions and implant.

(9) Mask 3: Define P- type LDD regions and implant.

(10) Form CVD sidewall spacers on polysilicon gate regions.

(11) Mask 4: Define N+ type source/drain regions and implant.

(12) Mask 5: Define P+ type source/drain regions and implant.

(13) Anneal implants

(14) Form nitride silicon glass (NSG) layer.

(15) Form BPSG layer overlying NSG layer.

(16) Mask 6: Define openings over source/drain regions.

(17) Form openings in NSG and BPSG layers to expose source/drain regions.

(18) Mask 7: Define P++ source/drain regions and implant.

(19) Mask 8: Define N++ source/drain regions and implant.

(20) Anneal implants.

(21) Perform remaining process steps.

The conventional fabrication method of the LDD structure relies upon at least eight mask steps. Each masking step adds to wafer turn-around-time. Each additional step can potentially introduce even more defects into the device, thereby decreasing valuable die per wafer. The following figures illustrate details of each of the fabrication steps briefly described above.

Figure 1:
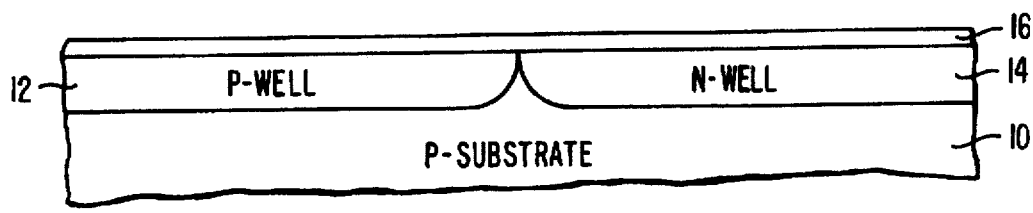
FIGS. 1–12 illustrate a simplified fabrication method for a conventional LDD in a CMOS device.

FIG. 1 illustrates a simplified cross-sectional view of a semiconductor substrate 10, typically the starting point for the CMOS fabrication process. The semiconductor substrate is a P type impurity substrate. A P type well region 12 and an N type well region 14 are defined onto the semiconductor substrate. The P type well region 12 and the N type well region 14 define the location for an N type channel device and P type channel device, respectively. A gate oxide layer 16 is grown overlying both the P type and N type well regions.

Figure 2:
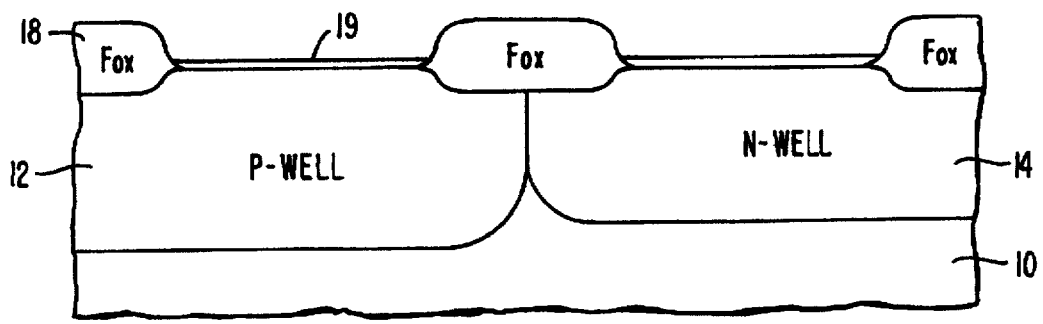

Field isolation oxide regions 18 are defined overlying the well regions 12, 14 as illustrated by FIG. 2. These field isolation oxide regions (FOX) 18 can be made by a technique known as the local oxidation of silicon (LOCOS). Typically, each of the well regions is separated from each other with the field isolation oxide region 18. A gate oxide layer 19 is defined overlying the well regions.

Figure 3:
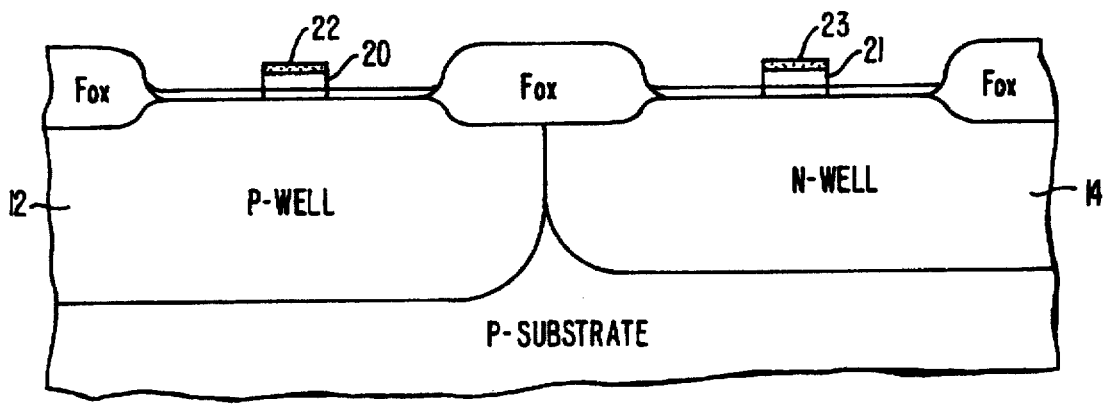

FIG. 3 illustrates gate polysilicon electrodes 20, 21 defined overlying the gate oxide layer 19 on the well regions 12, 14. The gate polysilicon electrode 20, 21, often termed as the poly 1 layer, is made using a series of conventional steps. These steps include depositing a layer of polysilicon overlying the top surface of the substrate, including P type well and N type well regions. Impurities are implanted into the polysilicon layer. The impurities are often N type dopants such as phosphorus and the like. The implant is then annealed. An oxide layer is defined overlying the polysilicon layer. The oxide layer acts as a mask for subsequent implant steps for the source/drain regions. The combination of the polysilicon layer and the oxide layer is then masked and etched to form the gate polysilicon electrodes 20, 21 and their overlying cap oxide layers 22, 23.

Figure 4:
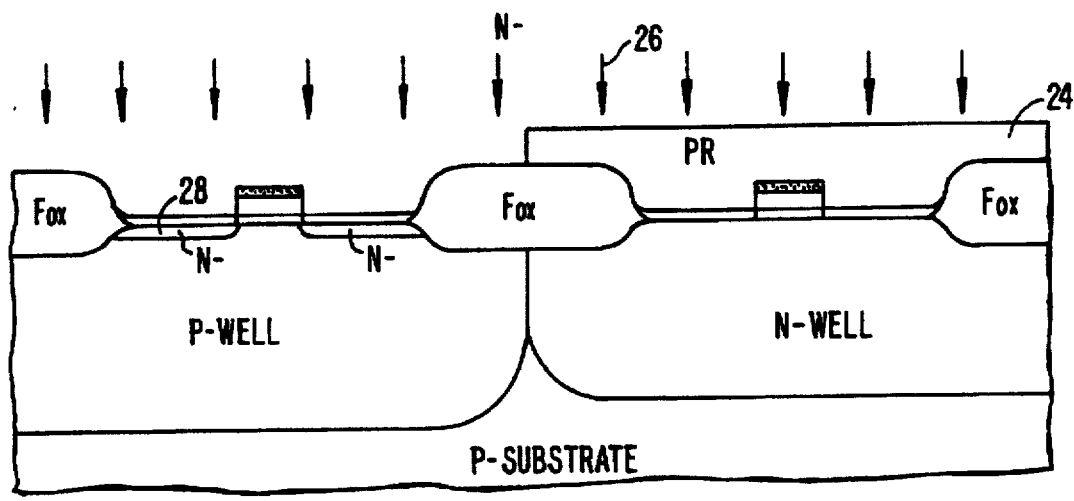
Figure 5:
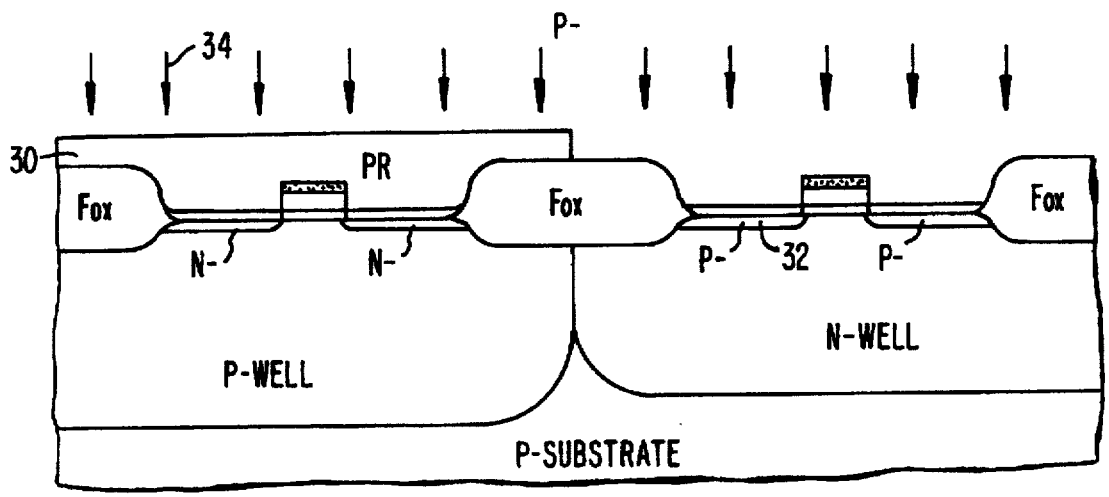

FIGS. 4 and 5 illustrate LDD implants made for the fabrication of N- type and P- type LDD regions. A mask 24 typically of photoresist overlying the top surface of the substrate exposes regions for the N- type LDD implant 26. The N- type implant forms the N- type LDD regions 28 for an N type channel device (NMOS). The mask 24 is then stripped by way of standard techniques known in the art. Another mask 30 exposes P- type LDD regions for the P- type LDD implant 34. The P- type implant forms the P- type LDD regions 32 for a P type channel device (PMOS). The NMOS and PMOS devices typify the CMOS process. Mask 30 is then stripped.

Figure 6:
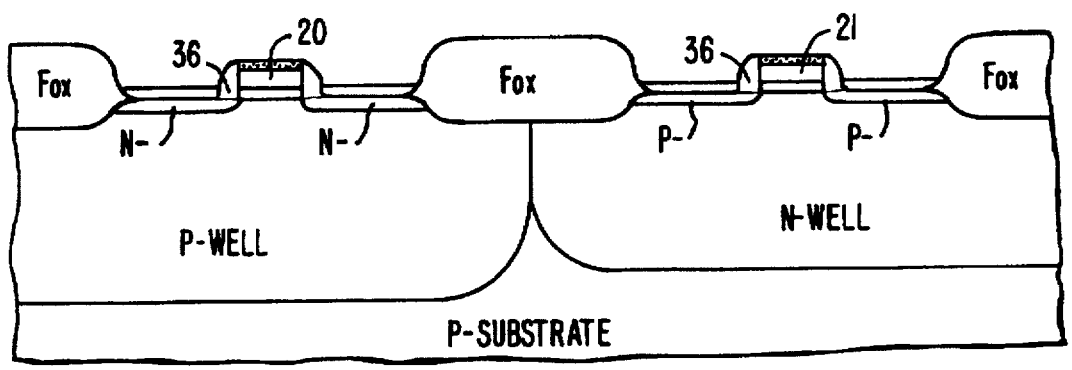

The conventional CMOS process defines CVD sidewall 36 on each of the gate electrodes 20, 21 as illustrated by FIG. 6. The sidewalls 36 are formed by CVD techniques. For example, a blanket CVD layer of oxide is formed overlying the top of the substrate, including gate electrodes and LDD regions. A step of anisotropic etching removes portions of the oxide layer on horizontal surfaces while leaving the oxide layer on the vertical surfaces intact. The remaining oxide layer defining the sidewalls is often subsequently densified. This sequence of steps forms conventional sidewalls, commonly termed spacers. A greater portion of the LDD region underlies the sidewall than a region directly underneath the gate electrode.

Figure 7:
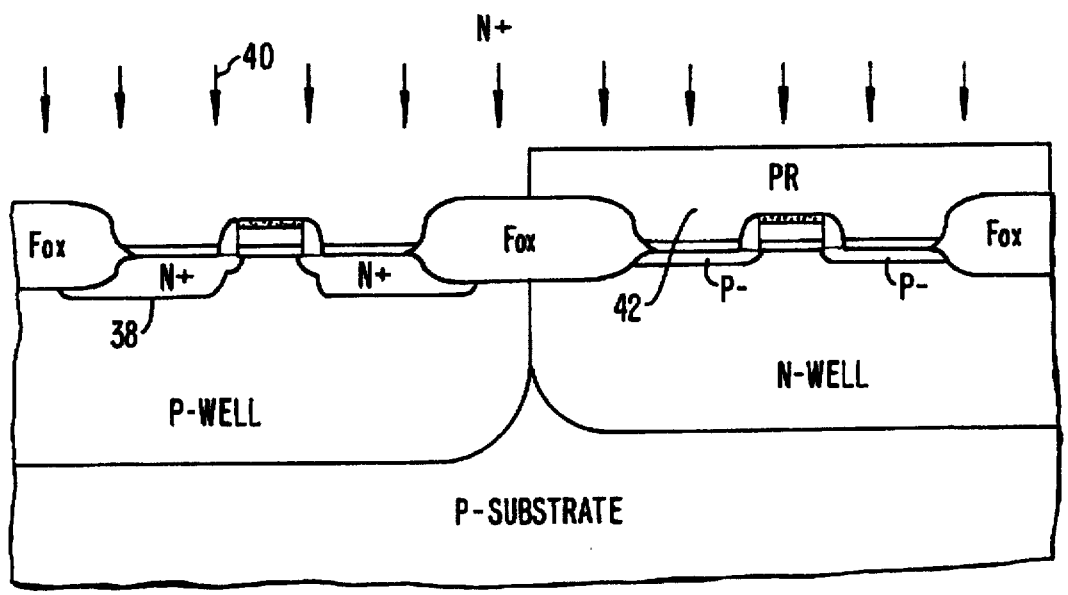
Figure 8:
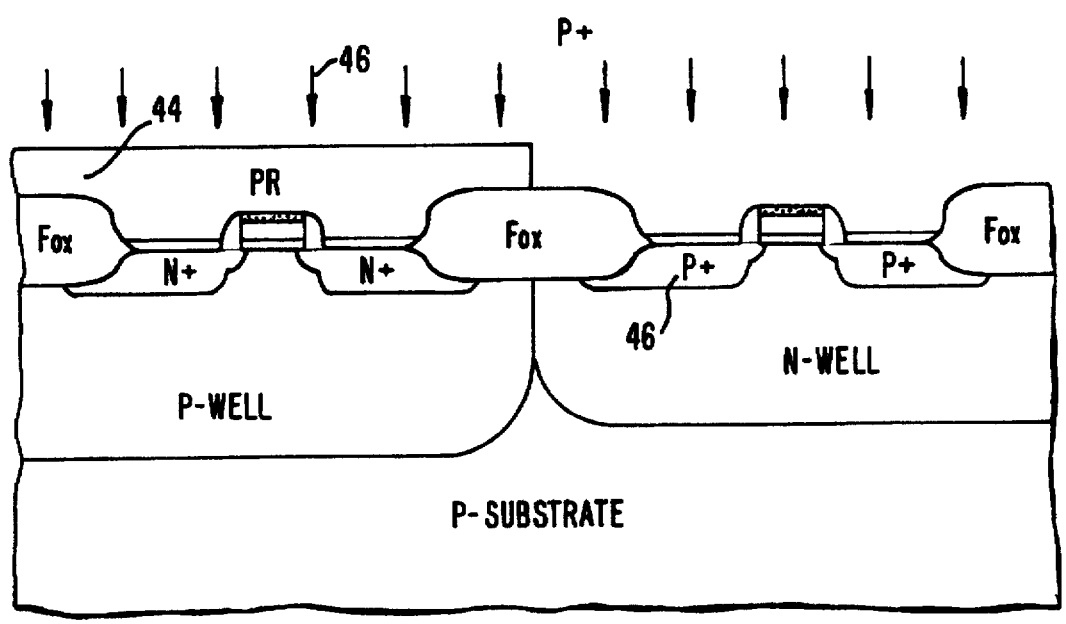

FIGS. 7 and 8 illustrate a method of forming source/drain regions 38, 46 for the NMOS device and the PMOS device, respectively. A mask 42 exposes the regions 38 for the NMOS source/drain implant, typically an N+ type implant 40. The mask 42 is stripped by way of any known technique, and another mask 44 exposes regions 46 for the PMOS source/drain implant, typically a P+ type implant 46. Mask 44 is then stripped.

Figure 9:
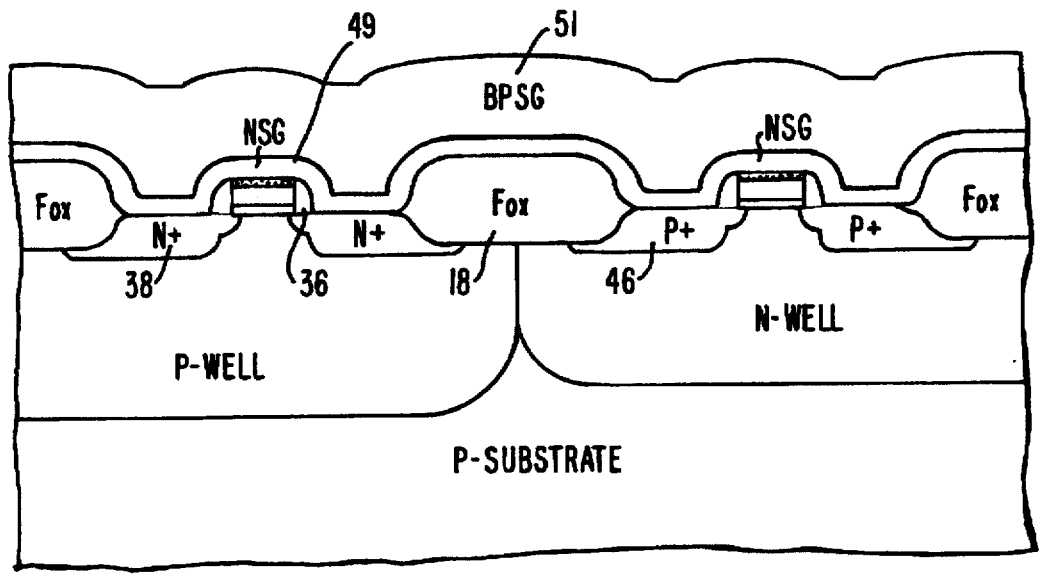

Insulating layers are defined overlying the top surface of the substrate, including source/drain regions 38, 46, sidewall spacers 36, and field isolation oxide regions 18, as illustrated by FIG. 9. A nitride silicon glass (NSG) layer 49 is defined overlying the top surface of the substrate. Conventional chemical vapor deposition techniques can be used to apply such nitride silicon glass layer. Similarly, chemical vapor deposition techniques can also be used to apply a borophosphosilicate glass layer (BPSG) layer 51 overlying the nitride silicon glass layer. The combination of these layers defines the insulating layers.

Figure 10:
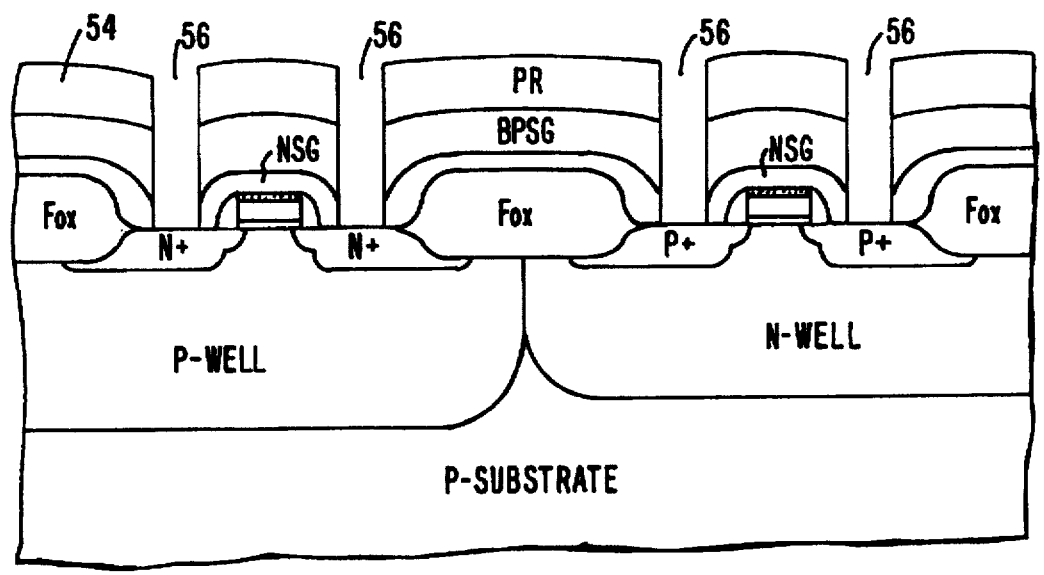

Masking steps define openings 56 overlying source/drain regions of each device as illustrated by FIG. 10. These masking steps generally include steps of masking 54, developing, and etching. Etching often occurs using conventional wet etchants such as hydrofluoric acid. Mask 54 is stripped using conventional techniques.

Figure 11:
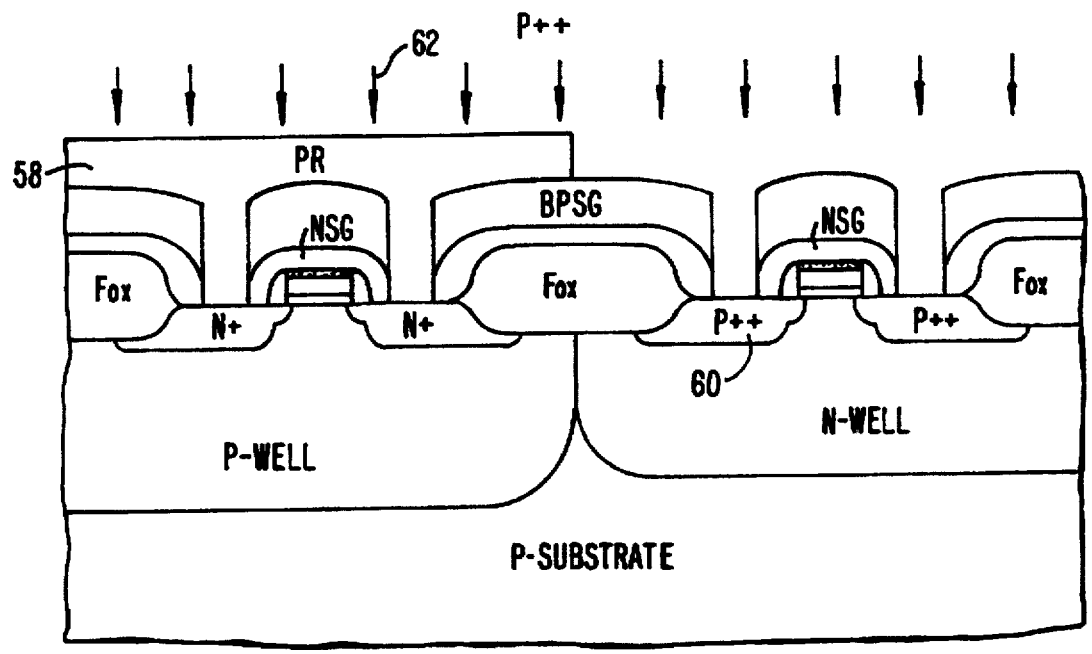
Figure 12:
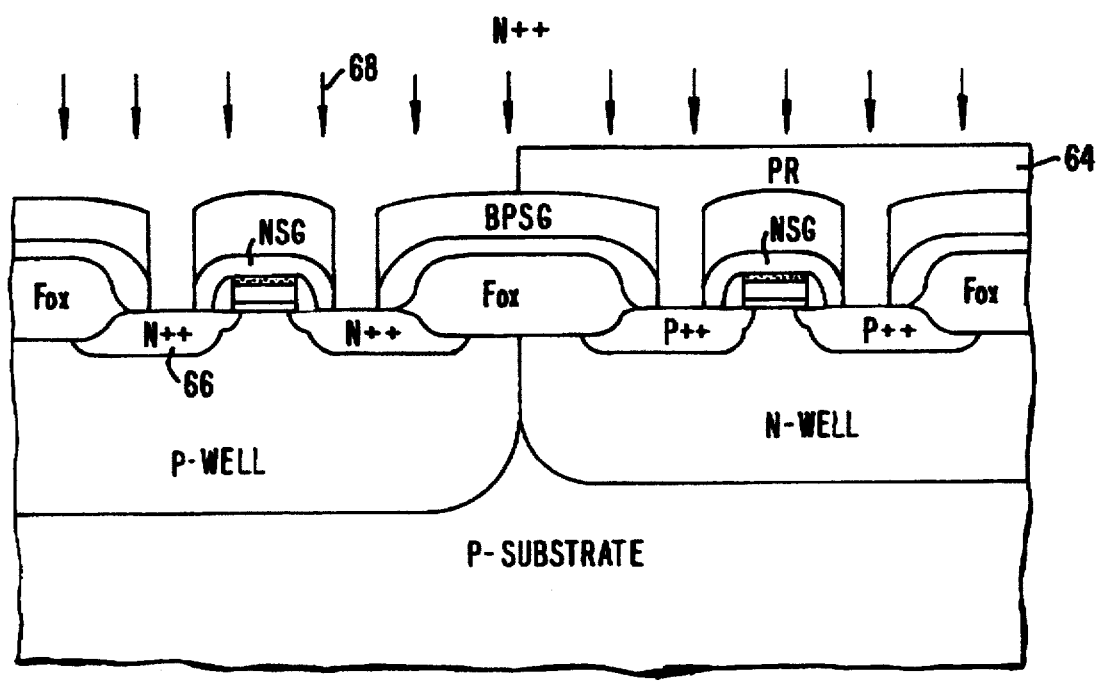

FIGS. 11 and 12 illustrate implanting second impurities comprising N++ type and P++ type into source/drain regions of the NMOS and the PMOS devices, respectively. These implants are also termed "contact implant plugs." A mask 58 exposes the regions 60 for the second PMOS source/drain implants, typically a P++ type implant 62. The mask 58 is stripped by way of any known technique, and another mask 64 exposes regions 66 for the NMOS source/drain implant, typically an N++ type implant 68. Mask 64 is then stripped using any known technique. Remaining process steps are then performed on these completed devices structures.

Conventional LDD Structures

Figure 13:
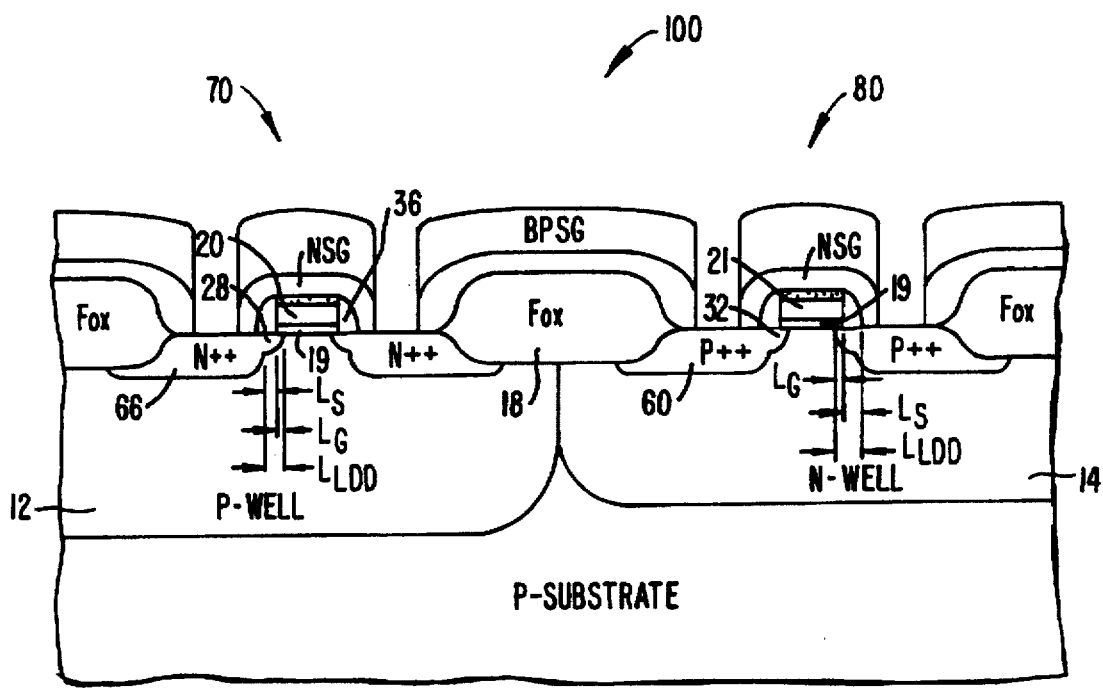
FIG. 13 is a simplified cross-sectional view of the conventional LDD structure according to the figures above.

FIG. 13 is a simplified cross-sectional view of a conventional CMOS device 100. The CMOS device includes an NMOS device 70 and a PMOS device 80. The NMOS and PMOS devices are defined in a P type well region 12 and an N type well region 14, respectively. Both P type and N type well regions are formed onto a semiconductor substrate. Field isolation oxide regions 18 typically formed by a technique known as the local oxidation of silicon (LOCOS) are often used to isolate and/or separate adjacent devices from each other. A gate oxide layer 19 is formed over both the P type and the N type well regions, and gate electrodes 20, 21 are defined overlying the gate oxide layer 19.

Both NMOS and PMOS devices include LDD regions 28 and 32, respectively. A portion $L_G$ of the LDD regions are defined underneath the gate electrodes. But another portion $L_S$ of the LDD regions are defined outside the gate electrode underlying sidewalls. In the NMOS device, $L_{LDD}$ ranges from about 0.12 µm to about 0.30 µm, and preferably is about 0.20 µm, with $L_G$ varying from about 0.07 82 m to about 0.14 µm, preferably about 0.10 µm, and with $L_S$ ranging from about 0.05 µm to about 0.15 µm, and preferably about 0.14 µm. In the PMOS device, $L_{LDD}$ ranges from about 0.15 µm to about 0.35 µm, and preferably is about 0.25 µm, with $L_G$ varying from about 0.12 µm to about 0.19 µm, preferably about 0.15 µm, and with $L_S$ ranging from about 0.05 µm to about 0.15 µm, and preferably about 0.14 µm. The sidewalls 36 typically oxides are formed at edges of the gate electrodes 20, 21. An N++ type region 66 is defined within a perimeter of the N− type LDD region. A P++ type region 60 is defined within a perimeter of the P− type LDD region. A combination of the N− type and N++ type region defines a source/drain region of the NMOS device, and a combination of the P− type and P++ type region defines a source/drain region of the PMOS device.

The CMOS device defines an active region of a typical semiconductor chip. AN active area of the chip often includes hundreds, thousands, or even millions of these microscopically small regions, each defining an active device. Of course, the particular use of the MOS device depends upon the particular application.

Present CMOS Embodiments

An embodiment of the present LDD fabrication method for a CMOS device may be briefly outlined as follows.

(1) Provide a semiconductor substrate.
(2) Grow oxide layer.
(3) Form P type wells and N type wells.
(4) Form filed isolation oxide regions using the local oxidation of silicon (LOCOS).
(5) Deposit gate polysilicon layer (or poly 1 layer) and dope.
(6) Form cap oxide layer overlying gate polysilicon layer.
(7) Mask 1: Define gate polysilicon layer to form polysilicon gate regions.

(8) Blanket implant N− type impurities to form N− type LDD regions.
(9) Form first sidewall spacers on polysilicon gate regions.
(10) Mask 2: Define N type source/drain regions and angle implant N+ type impurities and N++ type impurities.
(11) Mask 3: Define P type source/drain regions angle implant P− type LDD regions and P++ type source/drain regions.
(12) Anneal implants.
(13) Form nitride silicon glass (NSG) layer.
(14) Form BPSG layer overlying NSG layer.
(15) Mask 4: Define contact openings over source/drain regions.
(16) Perform remaining process steps.

The figures illustrate an embodiment of a fabrication method for an LDD structure in a CMOS device according to the present invention. The present method uses four general masking steps, rather than the conventional eight masking steps, resulting in a 50% reduction in masking steps. This use of less masking steps significantly decreases device turn-around-time. In addition, contact plug implants for N++ and P++ impurities occur before formation of the BPSG layer, thereby reducing the number of critical masking steps. The present process is thereby easier, and less costly than the above conventional technique. The embodiment of these figures is shown for illustrative purposes only, and therefore should not limit the scope of the invention recited by the claims. Furthermore, the method depicted by the figures is not necessarily to scale unless indicated otherwise.

Figure 14:
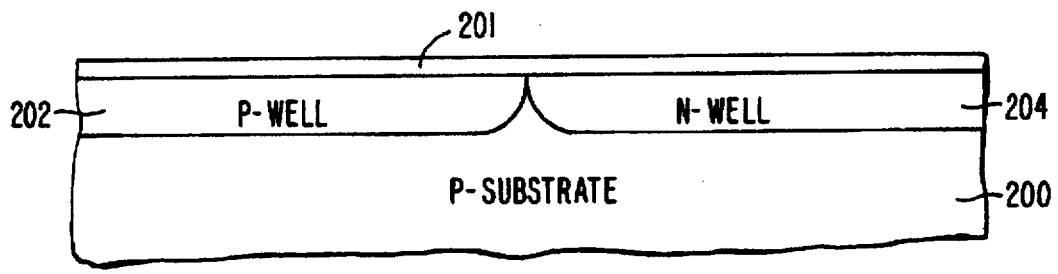
FIGS. 14-22 illustrate a simplified fabrication method according to the present invention.

FIG. 14 illustrates a partially completed semiconductor integrated circuit device according to the present invention. The partially completed device includes a semiconductor substrate 200 and an overlying thermal oxide layer 201. This overlying thermal oxide layer 201 has a thickness ranging from about 500 Å to about 1,500 Å, and is preferably about 1,000 Å. Of course, other thicknesses also can be used in the application.

A P type well region 202 and an N type well region 204, typifying a CMOS process, are defined into the semiconductor substrate. An N type channel MOS device and P type channel PMOS device are defined onto the P type well region 202 and the N type well region 204, respectively. Alternatively, the well regions may be N type and P type depending upon the particular application. These well regions are generally formed by techniques of masking, developing, etching, and others. Other techniques also can be used depending upon the application.

Figure 15:
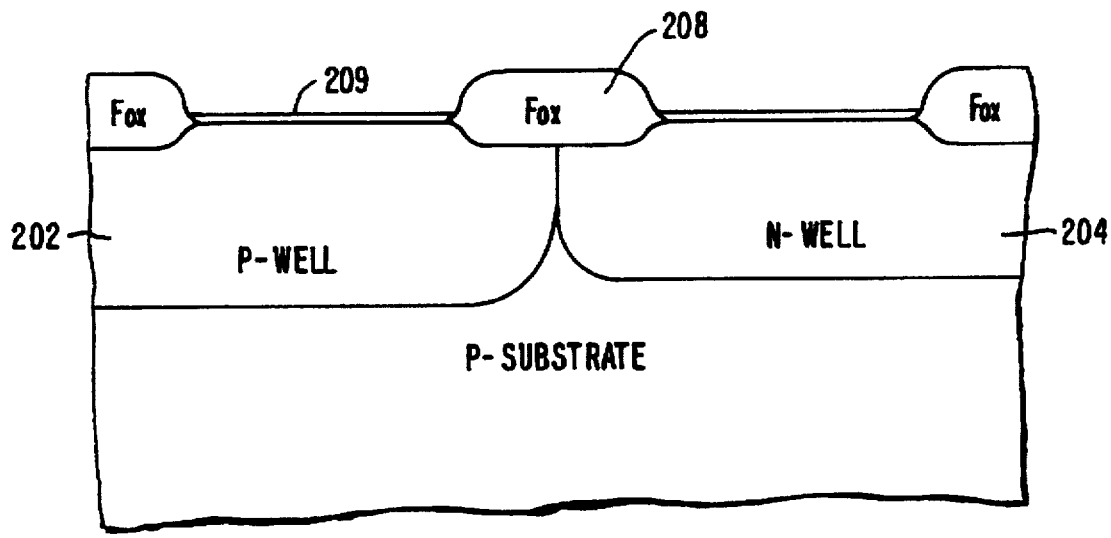

Field isolation oxide regions 208 are defined onto the semiconductor substrate using techniques such as the local oxidation of silicon (LOCOS) or the like, as illustrated by FIG. 15. LOCOS is typically used as a starting point for providing regions on the substrate used for device fabrication. However, other techniques may also be used depending upon the particular application.

A gate oxide layer 209 is formed overlying the top surface of both the P type 202 and the N type 204 regions. The gate oxide layer 209 is a high quality oxide, and is also typically thin to promote efficient switching of the device. The gate oxide layer is often a thermally grown layer, substantially free from pin-holes and the like. The thickness of such gate oxide layer typically ranges from about 40 Å to about 100 Å, and is preferably about 60 Å. Of course, the particular thickness depends upon the application.

Figure 16:
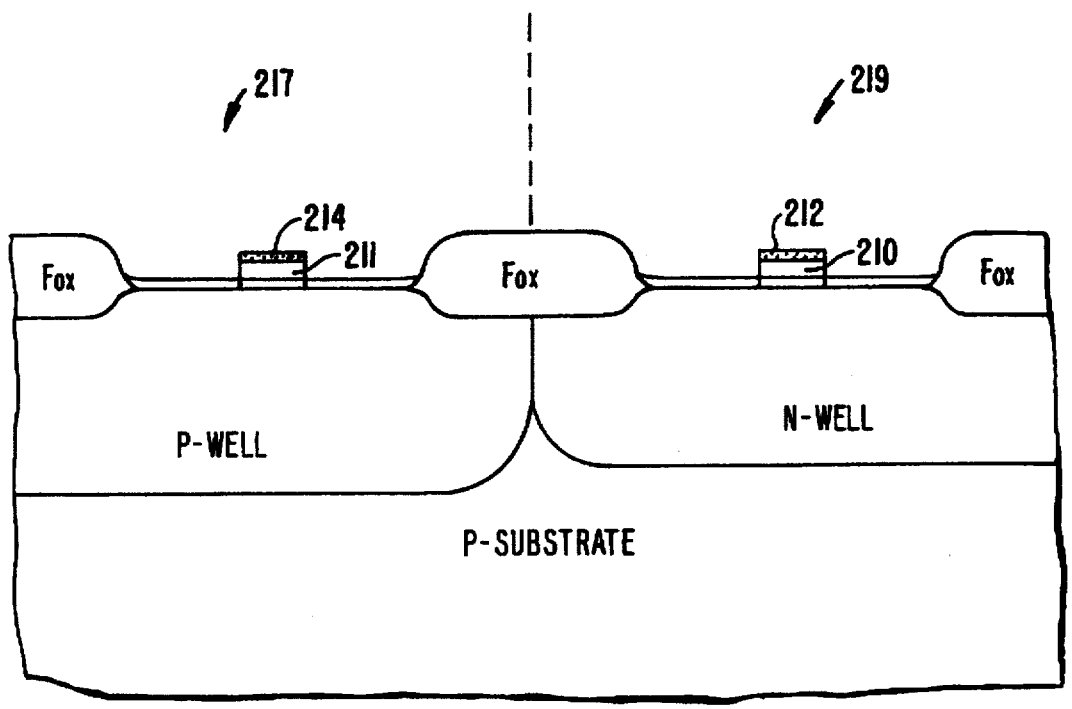

A polysilicon layer is formed over the substrate surface and in particular a gate oxide layer, as illustrated by FIG. 16.

A thickness of the polysilicon layer is likely ranged from about 2,500 Å to about 3,500 Å, and is preferably about 3,000 Å. The polysilicon layer is also typically doped with an N type impurity at a concentration of from about $3\times10^{20}$ to about $8\times10^{20}$ atoms/cm$^3$, and is preferably at about $5\times10^{20}$ atoms/cm$^3$. Of course, the polysilicon layer and its concentration depend upon the particular application.

The polysilicon layer is defined to form polysilicon gate electrodes 211, 210 as illustrated by FIG. 16. Sites for an NMOS device 217 and a PMOS device 219 are shown. The gate electrodes 211, 210 are often formed by any suitable series of photolithographic steps such as masking, developing, etching, and others. Each gate electrode includes edges having substantially vertical features, but also may have features which are not substantially vertical. The substantially vertical features are often made by way of anisotropic etching. Anisotropic etching occurs using techniques such as plasma etching, reactive ion etching, and others. Preferably, the polysilicon layer is formed with an overlying layer of dielectric material such as a cap oxide layer 214, 212. This cap oxide layer acts as a mask to protect the gate electrode during subsequent ion implantation steps or the like.

Figure 17:
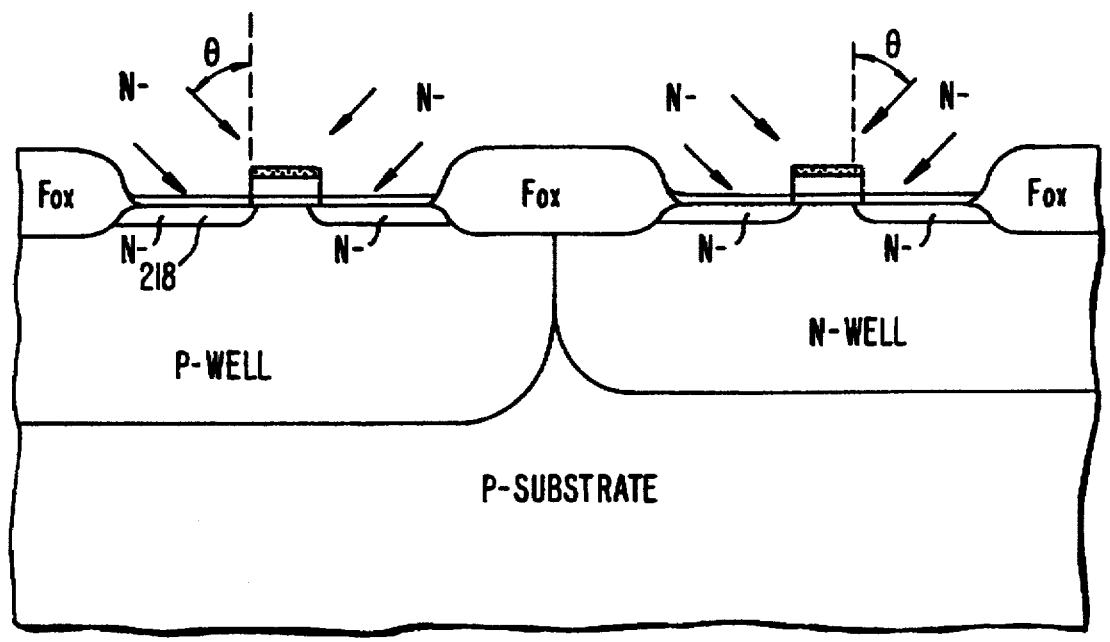

FIG. 17 illustrates LDD implants made for the fabrication of N− type LDD regions. The N− type implant forms the N− type LDD regions 218 for the N type channel device. This N− type implant is a blanket implant applied without the use of a photoresist mask. N− type impurities in the N well region will be masked by P type impurities during subsequent P type implant. Preferably, the N− type LDD regions use impurities such as phosphorus. Phosphorus can be found in compounds such as phosphine, or the like. This phosphorus is implanted using an energy ranging from about 30 to about 80 KeV, and is preferably at about 50 KeV. The phosphorus implant also has a $5\times10^{12}$ to about $5\times10^{13}$ atoms/cm$^2$ dose, and is preferably at about $1\times10^{13}$ atoms/cm$^2$ dose. Preferably, N− type impurities can be angle implanted into the LDD regions at an angle θ ranging from about 0° to about 60°, and preferably at 45°.

Figure 18:
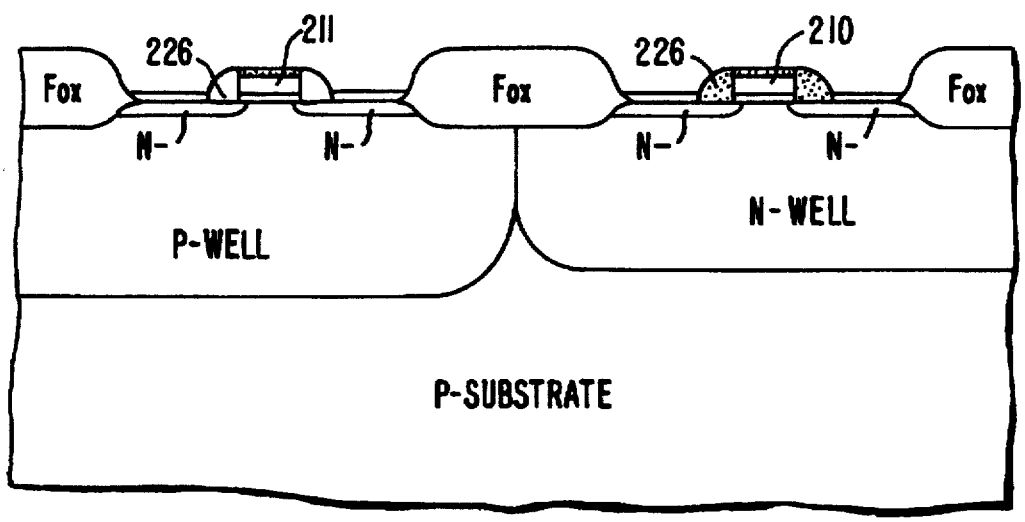

The present process defines sidewalls 226 on each of the gate electrodes 211, 210, as illustrated by FIG. 18. The sidewall can be formed of any suitable dielectric material such as silicon dioxide, silicon nitride, and the like. These dielectric materials can be formed by any suitable CVD techniques. For example, a blanket CVD layer of oxide is formed overlying the top of the substrate, including gate electrodes and LDD regions. The blanket CVD oxide layer can be any suitable material such as CVD oxide, TEOS, and others. Alternatively, the sidewalls can be applied using thermal oxidation techniques and the like. A step of anisotropic etching removes portions of the dielectric layer on horizontal surfaces while leaving the dielectric layer on the vertical surfaces intact. The remaining dielectric layer defining the sidewalls is subsequently densified. This sequence of steps forms sidewalls, commonly termed spacers. The present spacers each include a space width ranging from about 2,000 Å to about 4,000 Å, and is preferably at about 3,000 Å. Of course, other widths also can be used depending upon the application.

Figure 19:
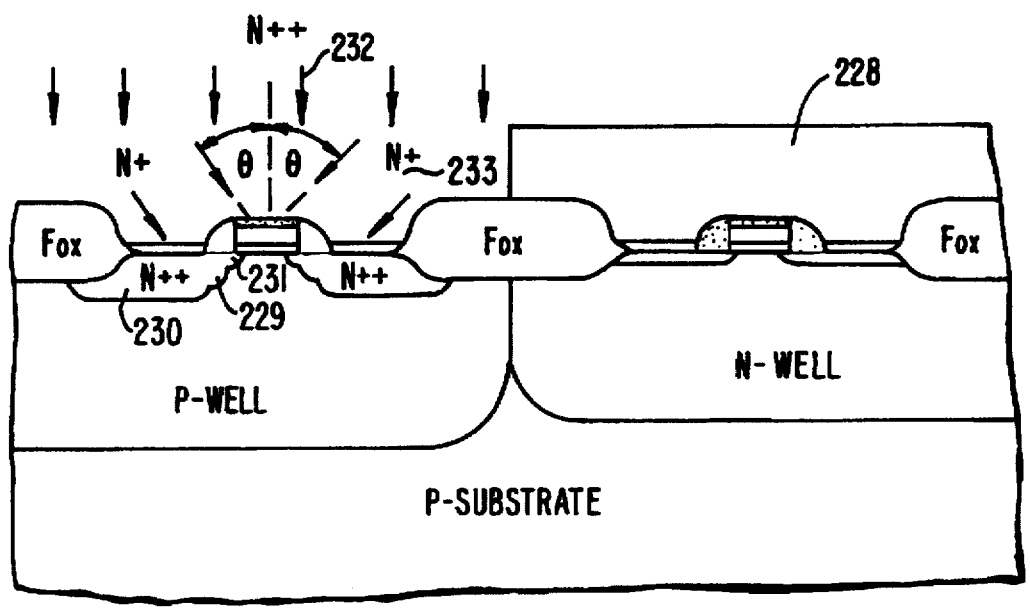

Mask 228 is defined overlying the top surface of the substrate to expose regions 229, 230, and 231 for an N+ type source/drain implant 233 and an N++ type source/drain implant 232, as illustrated by FIG. 19. N+ type impurities are introduced into the source/drain regions of the NMOS device. The impurity can be any suitable N+ type impurity such as arsenic or the like. Arsenic implant energy ranges from about 60 KeV to about 90 KeV, and is preferably at about 75 KeV. This implant can be performed using a dose ranging from about $1\times10^{14}$ to about $3\times10^{15}$ atoms/cm$^2$, and is preferably at about $3\times10^{15}$ atoms/cm$^2$. Preferably, N+ type impurities can be angle implanted into the source/drain regions at an angle θ ranging from about 0° to about 60°, and preferably about 45°. N++ type impurities 232 are introduced into the source/drain regions by ion implantation techniques. The implant step uses N++ type impurities 232 such as phosphorus. This phosphorus has an energy ranging from about 30 KeV to 80 KeV, and is preferably at about 50 KeV. Phosphorus also has a dosage of about $3\times10^{15}$ to about $6\times10^{15}$ atoms/cm$^2$, and is preferably at about $5\times10^{15}$ atoms/cm$^2$. Mask 228 is stripped using conventional techniques.

Figure 20:
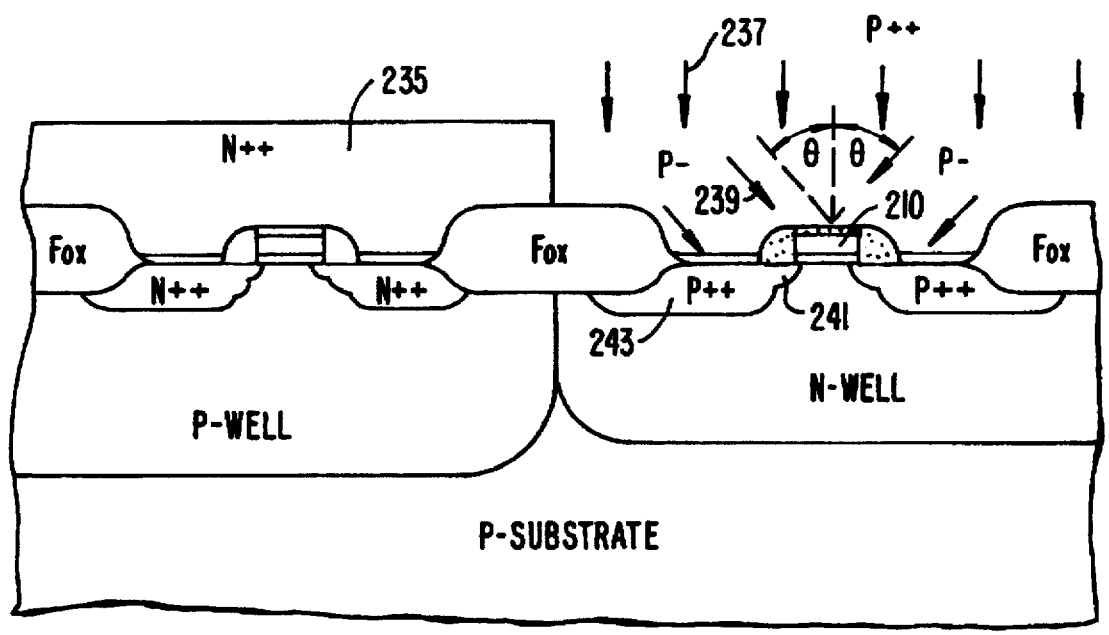

Mask 235 exposes regions defining LDD regions 241 and source/drains 243 for the PMOS device, as illustrated by FIG. 20. A P++ type impurity 237 is introduced into these source/drain regions 243 through the exposed regions. The P++ type impurities 237 can be any suitable impurity such as boron or the like. Preferably, the boron is selected from a compound such as boron trifluoride, boron difluoride, or the like. Boron is introduced at an energy ranging from about 30 KeV to about 60 KeV, and is preferably at about 50 KeV. The boron implant also has a dosage of about $2\times10^{15}$ to about $6\times10^{15}$ atoms/cm$^2$, and is preferably at about $4\times10^{15}$ atoms/cm$^2$.

A P− type implant 239 introduces P type impurities into the substrate defining LDD regions 241. Preferably, the P− type LDD regions use impurities such as boron. Boron can be found in compounds such as boron trifluoride, boron difluoride, or the like. This boron is implanted using an energy ranging from about 30 KeV to about 120 KeV, and is preferably at about 60 KeV. Boron also has a $1\times10^{13}$ to $3\times10^{13}$ atoms/cm$^2$ dose, and is preferably at about $2\times10^{13}$ atoms/cm$^2$ dose. The P− type implant also is angle implanted into the LDD regions 241. The angle θ ranges from about 0° to about 60°, and is preferably 45° or less from a line perpendicular to the gate electrode 210. Alternatively, the P− type implant can occur before the P++ type implant depending upon the particular application. Mask 235 is stripped using conventional techniques.

Figure 21:
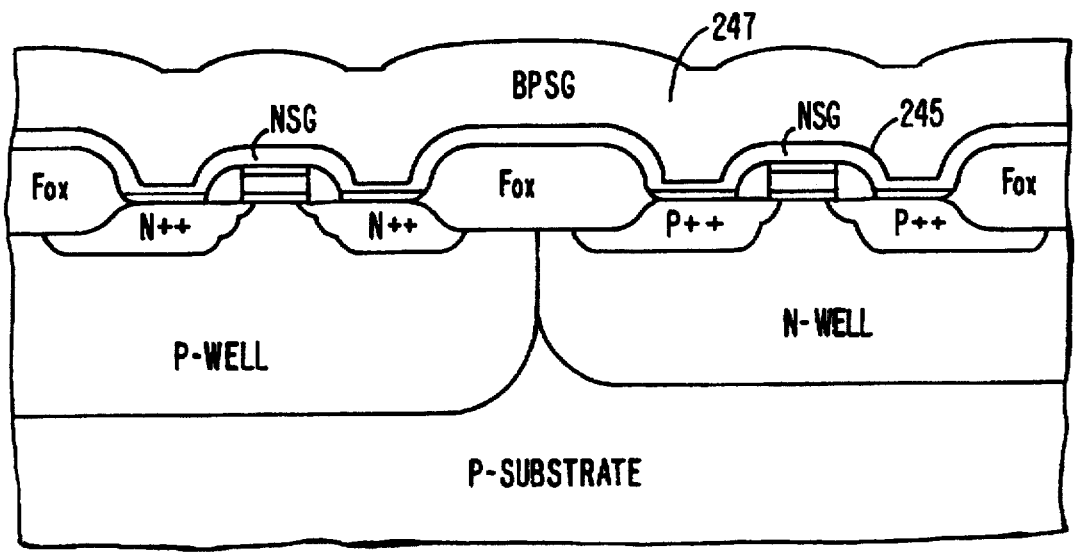

Insulating layers are defined overlying the top surface of the substrate, including source/drain regions, sidewall spacers, and field isolation oxide regions, as illustrated by FIG. 21. A nitride silicon glass (NSG) layer 245 is defined overlying the top surface of the substrate. Conventional chemical vapor deposition techniques can be used to apply such nitride silicon glass layer. Similarly, chemical vapor deposition techniques can also be used to apply a borophosphosilicate glass layer (BPSG) 247 overlying the nitride silicon glass layer. The combination of these layers defines the insulating layers.

Figure 22:
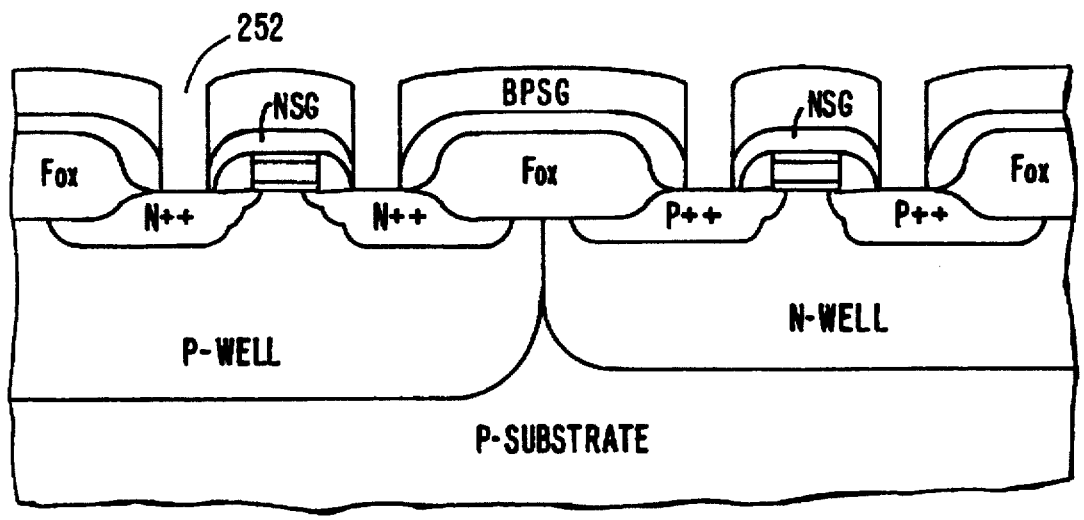

Opening 252 are defined in the BPSG layer 250 overlying source/drain regions, as illustrated by FIG. 22. These openings or vias are used as contact openings. Preferably, the top surface of each source/drain region is "cleared" from oxides before applying contact metallization on such source/drain region. Typical masking and etching techniques can be used in defining the openings 252. Etching techniques include wet etching using hydrofluoric acid and the like.

Present LDD Structures

Figure 23:
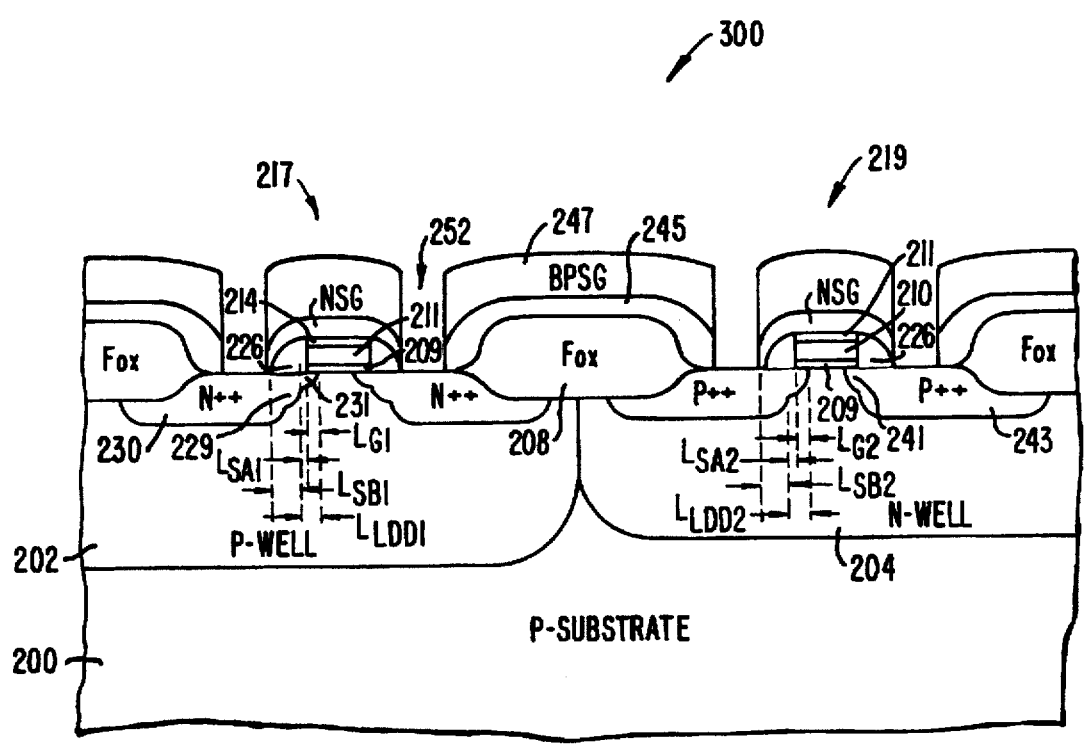
FIG. 23 is a simplified cross-sectional view diagram of the LDD structure according to the present invention.

FIG. 23 is a simplified cross-sectional view diagram of a resulting device 300 from the above method. The present CMOS device includes an NMOS device 217 and a PMOS device 219. The NMOS and PMOS devices are defined in a P type well region 202 and are N type well region 204, respectively. Both P type and N type well regions are formed onto a semiconductor substrate 200. Field oxide regions 208 typically formed by a technique known as the local oxidation of silicon (LOCOS) are often used to isolate and/or separate adjacent devices from each other. A gate oxide layer 209 is formed over both the P type and the N type well regions, and gate electrodes 210, 211 are defined overlying the gate oxide layer 209.

In the NMOS device, a portion $L_{G1}$ of the LDD region 231 is defined underneath the gate electrode 211. But another portion, including $L_{SA1}$, of the region 231 is defined outside the gate 45 electrode 211 underlying sidewall 226. $L_{SB1}$ of region 229 is also defined underlying sidewall 226 and outside gate electrode 211. $L_{G1}$ of LDD region 231 underlying the gate electrode is greater than $L_{SA1}$ of LDD region 231 underlying the sidewall. $L_{G1}$ may range from about 0.07 μm to about 0.14 μm, and is preferably about 0.10 μm. $L_{SA1}$ may range from about 0.05 μm to about 0.10 μm, and is preferably about 0.07 μm. $L_{SB1}$ may range from about 0.10 μm to about 0.15 μm, and is preferably about 0.12 μm. $L_{LDD1}$ defines the LDD region 231 and $L_{SB1}$ defines part of the source/drain region. According to various embodiments, $L_{LDD1}$ may range from about 0.1 μm to about 0.18 μm, and is preferably about 0.13 μm. $L_{SB1}$ may range from about 0.1 μm to about 0.2 μm, and is preferably about 0.15 μm. In the PMOS device, a portion $L_{G2}$ of the LDD region 241 is defined underneath the gate electrode 210. But another portion, including $L_{SA2}$, of the LDD region 241 is defined outside the gate electrode 210 underlying sidewall 226. A portion $L_{SB2}$ of region 243 is also defined underlying sidewall 226 and outside gate electrode 210. LDD region 241 is defined by $L_{LDD2}$. $L_{G2}$ of LDD region 241 underlying the gate electrode is greater than $L_{SA2}$ of LDD region 241 underlying the sidewall. According to various embodiments, $L_{G2}$ may range from about 0.12 μm to about 0.19 μm, and is preferably about 0.15 μm. $L_{SA2}$ may range from about 0.05 μm to about 0.10 μm, and is preferably about 0.07 μm. $L_{SB2}$ may range from about 0.15 μm to about 0.20 μm, and is preferably about 0.17 μm. $L_{LDD2}$ may range from about 0.20 μm to about 0.25 μm, and is preferably about 0.20 μm. Advantages of the present structures include, for example, optimization of the LDD structure, faster turn-around time in production, and lowering of the source/drain resistance in the NMOS device. The sidewalls 226 typically oxides are formed at edges of the gate electrodes 211, 210. An N++ region 230 and N+ region 229 are defined within a perimeter of the N− type LDD region 231. A P++ type region 243 is defined within a perimeter of the P− type LDD region 241. A combination of the N− type, N+ type and N++ type regions defines a source/drain region of the NMOS device, and a combination of the N− type, P− type and P++ type regions defines a source/drain region of the PMOS device.

Switching each of the devices occurs by applying a voltage to the gate electrode. The voltage at the gate electrode forms a channel underneath the gate electrode. In the NMOS device, an N type channel of conductive material connects the source and drain regions together by way of voltage applied to the gate electrode, thereby switching the device to an "ON" state. Alternatively, when no voltage is applied to the gate electrode, P type semiconductor material isolates the source region from the drain region. In the PMOS device, a P type channel of conductive material connects the source and drain regions together by way of voltage applied to the gate electrode. This switches the PMOS device to an "ON" state. Alternatively, the PMOS device is in an "OFF" state when no voltage is applied to the gate electrode.

While the above is a full description of the specific embodiments, various modifications, alternative constructions and equivalents may be used. For example, while the description above is in terms of an LDD structure in a CMOS integrated circuit device, it would be possible to implement the present invention with BiCMOS, MOS, or the like.

Therefore, the above description and illustrations should not be taken as limiting the scope of the present invention which is defined by the appended claims.

What is claimed is:

1. A method of fabricating a CMOS integrated circuit device, said method comprising:

providing a semiconductor substrate, said semiconductor substrate comprising a first well region of a first conductivity type and a second well region of a second conductivity type, said first well region having a first gate electrode overlying a first gate dielectric layer, said second well region having a second gate electrode overlying a second gate dielectric layer;

blanketly introducing a first impurity of said second conductivity type into said first well region and said second well region, said first impurity in said first well region defining a first LDD region;

forming first sidewall spacers on edges of said first gate electrode and second sidewall spacers on edges of said second gate electrode;

introducing a second impurity of said second conductivity type into said first well region and introducing a third impurity of said second conductivity type into said first well region said second impurity in said first well region defining a first dose of a first source/drain region, said third impurity in said first well region defining a second dose of said first source/drain region; and introducing a fourth impurity of said first conductivity type into said second well region and introducing a fifth impurity of said first conductivity type into said second well region, said fourth impurity in said second well region defining a second LDD region, said fifth impurity in said second well region defining a second source/drain region.

2. The method of claim 1 wherein said first conductivity type is a P type.

3. The method of claim 1 wherein said second conductivity type is an N type.

4. The method of claim 1 wherein said first impurity is an N− type.

5. The method of claim 1 wherein said first impurity is an N− type, said second impurity is an N+ type, and said third impurity is an N++ type.

6. The method of claim 5 wherein said first impurity is angle implanted.

7. The method of claim 5 wherein said second impurity is angle implanted.

8. The method of claim 1 wherein said first impurity is an N− type, said second impurity is an N+ type, said third impurity is an N++ type, said fourth impurity is a P− type, and said fifth impurity is a P++ type.

9. The method of claim 8 wherein said fourth impurity is angle implanted.

10. The method of claim 1 wherein each of said first sidewall spacers is provided with a width ranging from about 0.2 to about 0.4 microns.

11. The method of claim 1 wherein each of said second sidewall spacers is provided with a width ranging from about 0.2 to about 0.4 microns.

* * * * *